(12) United States Patent
Park et al.

(10) Patent No.: US 11,963,403 B2
(45) Date of Patent: Apr. 16, 2024

(54) DISPLAY DEVICE HAVING A LIGHT-BLOCKING MATERIAL IN AN INSULATING LAYER BETWEEN A TRANSISTOR AND A LIGHT-EMITTING ELEMENT AND MANUFACTURING METHOD THEREOF

(71) Applicant: SAMSUNG DISPLAY CO., LTD., Yongin-si (KR)

(72) Inventors: Seung Hyun Park, Seoul (KR); Joo Sun Yoon, Seoul (KR); Woo Sik Jun, Seongnam-si (KR); Yun-Mo Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/539,648

(22) Filed: Aug. 13, 2019

(65) Prior Publication Data
US 2020/0111853 A1 Apr. 9, 2020

(30) Foreign Application Priority Data
Oct. 5, 2018 (KR) .......................... 10-2018-0118767

(51) Int. Cl.
*H10K 59/124* (2023.01)
*H10K 50/813* (2023.01)
(Continued)

(52) U.S. Cl.
CPC ......... *H10K 59/124* (2023.02); *H10K 50/813* (2023.02); *H10K 50/816* (2023.02); *H10K 59/38* (2023.02); *H10K 71/00* (2023.02)

(58) Field of Classification Search
CPC .............. H01L 27/322; H01L 27/3246; H01L 51/5284; H01L 51/56; H01L 27/3258;
(Continued)

(56) References Cited

U.S. PATENT DOCUMENTS 6,758,538 B2 7/2004 Fujita et al.
6,940,566 B1* 9/2005 Rho .................. G02F 1/136213
257/59
(Continued)

FOREIGN PATENT DOCUMENTS

KR 10-2022-0025840 4/2002
KR 100477128 3/2005
(Continued)

*Primary Examiner* — David Chen
(74) *Attorney, Agent, or Firm* — F. CHAU & ASSOCIATES, LLC

(57) ABSTRACT

A display device includes a first substrate. A transistor is disposed on the first substrate. A light-emitting element is connected to the transistor. An insulating layer is disposed between the transistor and the light-emitting element. A second substrate at least partially overlaps the first substrate. A color conversion layer is disposed on the second substrate. The insulating layer includes a first insulating layer and a second insulating layer. A distance between the first insulating layer and the first substrate is less than a distance between the second insulating layer and the first substrate. The first insulating layer includes a light blocking material.

9 Claims, 15 Drawing Sheets

(51) Int. Cl.
*H10K 50/816* (2023.01)
*H10K 59/38* (2023.01)
*H10K 71/00* (2023.01)

(58) Field of Classification Search
CPC ........... H01L 27/3272; H01L 29/78633; H01L 51/5209; H01L 51/5215; H10K 59/124; H10K 50/813; H10K 50/816; H10K 59/38; H10K 71/00
USPC .............. 257/40, 59, 72, 29.273; 438/29, 34
See application file for complete search history.

(56) References Cited

U.S. PATENT DOCUMENTS

| | | | |
|---|---|---|---|
| 10,373,978 B2 | 8/2019 | Lee et al. | |
| 2002/0038998 A1* | 4/2002 | Fujita | H01J 1/70 313/495 |
| 2003/0089913 A1* | 5/2003 | Takayama | H01L 27/3258 257/79 |
| 2003/0129790 A1* | 7/2003 | Yamazaki | H01L 27/3246 438/149 |
| 2005/0029926 A1* | 2/2005 | Park | H01L 51/5284 313/500 |
| 2006/0060870 A1* | 3/2006 | Park | H01L 27/322 257/88 |
| 2007/0238227 A1* | 10/2007 | Jun | H01L 27/1255 438/164 |
| 2007/0278480 A1* | 12/2007 | Hwang | H01L 27/1255 257/40 |
| 2008/0042146 A1* | 2/2008 | Cok | H01L 27/322 257/79 |
| 2011/0049519 A1* | 3/2011 | Kim | H01L 27/1288 257/E33.053 |
| 2011/0114957 A1* | 5/2011 | Kim | H01L 29/78633 257/59 |
| 2012/0043546 A1* | 2/2012 | Oh | H01L 27/127 438/34 |
| 2016/0087245 A1* | 3/2016 | Park | H10K 50/858 257/40 |
| 2016/0202469 A1* | 7/2016 | Sampsell | G02B 26/02 345/85 |
| 2016/0372709 A1* | 12/2016 | Lee | H10K 85/324 |
| 2017/0205669 A1* | 7/2017 | Ono | G02F 1/133514 |
| 2018/0033848 A1* | 2/2018 | Jung | H10K 59/124 |
| 2018/0122864 A1* | 5/2018 | Lee | G06F 3/0446 |
| 2018/0204769 A1* | 7/2018 | Xu | H01L 27/3258 |
| 2019/0051709 A1* | 2/2019 | Puszka | H01L 27/3227 |
| 2019/0220644 A1* | 7/2019 | Sun | H01L 51/5253 |

FOREIGN PATENT DOCUMENTS

| | | |
|---|---|---|
| KR | 1020160082760 | 7/2016 |
| KR | 1020170045757 | 4/2017 |
| KR | 1020170051764 | 5/2017 |
| KR | 1020180014334 | 2/2018 |
| KR | 1020180018969 | 2/2018 |
| KR | 10-2018-0087908 | 8/2018 |

* cited by examiner

DISPLAY DEVICE HAVING A LIGHT-BLOCKING MATERIAL IN AN INSULATING LAYER BETWEEN A TRANSISTOR AND A LIGHT-EMITTING ELEMENT AND MANUFACTURING METHOD THEREOF

CROSS-REFERENCE TO RELATED APPLICATION

This application claims priority to and the benefit of Korean Patent Application No. 10-2018-0118767 filed in the Korean Intellectual Property Office on Oct. 5, 2018, the entire contents of which are herein incorporated by reference.

TECHNICAL FIELD

The present disclosure relates to a display device and, more specifically, to a display device having a light-blocking material in an insulating layer disposed between a transistor and a light-emitting element, and a manufacturing method thereof.

DISCUSSION OF THE RELATED ART

A light emitting diode (LED) is a solid-state element that is able to produce light by combining holes supplied from an anode and electrons supplied from a cathode within an organic emission layer. As electron-hole pairs combine, excitons are formed, and light is emitted as the excitons relax.

The light emitting diode has several merits such as a wide viewing angle, a fast response speed, a thin structure, and lower power consumption, such that light emitting diodes may be used in various display technologies which are widely applied to various electrical and electronic devices such as a television, a monitor, a mobile phone, etc.

Recently, a display device including a color conversion layer has been proposed to realize a high efficiency display device.

SUMMARY

A display device includes a first substrate. A transistor is disposed on the first substrate. A light-emitting element is connected to the transistor. An insulating layer is disposed between the transistor and the light-emitting element. A second substrate at least partially overlaps the first substrate. A color conversion layer is disposed on the second substrate. The insulating layer includes a first insulating layer and a second insulating layer. A distance between the first insulating layer and the first substrate is less than a distance between the second insulating layer and the first substrate. The first insulating layer includes a light blocking material.

A method for manufacturing a display device includes forming a transistor on a first substrate. A first insulating layer, including a light blocking material, is formed on the transistor. A second insulating layer is formed on the first insulating layer. The second insulating layer is configured to transmit light. The first insulating layer and second insulating layer are patterned, using a single mask, to form an opening in the first insulating layer and the second insulating layer. A first electrode is formed. The first electrode is connected to the transistor through the opening.

A display device includes a first substrate. A semiconductor layer is disposed on the first substrate. An interlayer insulating layer is disposed on the semiconductor layer. A source electrode and a drain electrode are disposed on the interlayer insulating layer. An insulating layer is disposed on the source electrode and the drain electrode. A first electrode is disposed on the insulating layer. The interlayer insulating layer and/or the insulating layer includes a light blocking material.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
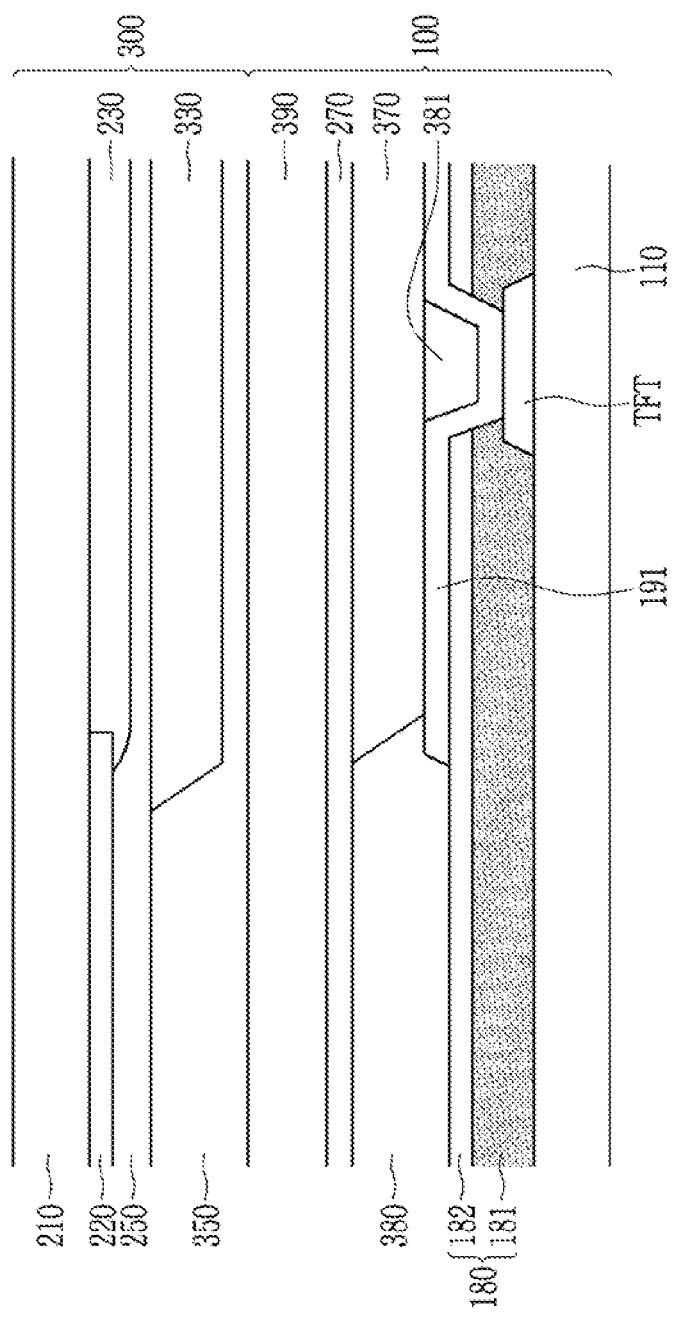
FIG. 1 is a schematic diagram illustrating a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the figures, some elements may be omitted for clarity. The same reference numerals may represent the same or similar constituent elements throughout the specification and figures.

In addition, the size and thickness of each configuration shown in the drawings may be exaggerated for better understanding and ease of description, and the present invention is not necessarily limited to the exact configuration shown. For example, in the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

A display device, according to an exemplary embodiment of the present invention, is described in detail with reference to accompanying drawings. FIG. 1 is a schematic diagram illustrating a display device according to an exemplary embodiment of the present invention.

Referring to FIG. 1, the display device, according to an exemplary embodiment of the present invention, includes a first substrate 110 and a second substrate 210 at least partially overlapping the first substrate 110. The first substrate 110 is part of a display panel 100. The display panel 100 further includes a light-emitting element layer 370. The second substrate 210 is part of a color conversion panel 300. The color conversion panel 300 further includes a color filter 230 and a color conversion layer 330.

In the display panel 100, a transistor TFT is connected to a first electrode 191 that is disposed on the first substrate 110, and an insulating layer 180 is disposed between the first electrode 191 and the first substrate 110. The insulating layer 180 may include an organic material.

The insulating layer 180 includes a first insulating layer 181 and a second insulating layer 182, and the first insulating layer 181 includes, or is itself, a material that does not transmit light (e.g. it absorbs or reflects light). For example, the first insulating layer 181 may include a black matrix material. As will be described in detail later, by blocking light, the first insulating layer 181 may prevent the transistor TFT from being damaged by light emitted from the light-emitting element layer 370.

Referring to FIG. 1, a partition wall 380 including an opening is disposed at the first electrode 191, and a second electrode 270 is disposed over the partition wall 380. The light-emitting element layer 370 is disposed at the opening of the partition wall 380. The light-emitting element layer 370 emits light by maintaining a voltage difference between the first electrode 191 and the second electrode 270.

The insulating layer 180 is removed (or otherwise omitted) at a region where the first electrode 191 and the transistor TFT are in contact with each other, thereby forming the opening. A portion of the first electrode 191 disposed at the opening of the insulating layer 180 is recessed relative to the other portions of the first electrode 191 such that a step occurs. A planarization layer 381 may be disposed at the step region such that a top surface of the planarization layer 381 is in a plane with a top surface of the above-mentioned other portions of the first electrode 191. The planarization layer 381 includes the same material as the partition wall 380, and may be formed by the same process as the partition wall 380. The planarization layer 381 compensates for the step of the first electrode 191 so that the light-emitting element layer 370 is disposed on a flat surface. When the planarization layer 381 is omitted, the upper surface of the light-emitting element layer 370 might not be flat. However, this is only an example, and the planarization layer 381 may be omitted.

An encapsulation layer 390 may be disposed on the second electrode 270. The encapsulation layer 390 may include an organic layer and an inorganic layer that are alternately stacked.

In the color conversion panel 300, a color filter 230 is disposed under the second substrate 210. In this case, the color filter 230 is disposed between the first substrate 110 and the second substrate 210. A light blocking member 220 is disposed between the color filter 230 and the second substrate 210, and the light blocking member 220 may partially overlap the color filter 230.

A color filter insulating layer 250 is disposed under the color filter 230 and the light blocking member 220. The color conversion layer 330 is disposed under the color filter insulating layer 250. For example, the color filter insulating layer 250 is disposed between the color conversion layer 330 and the color filter 230. The color conversion layer 330 may be disposed to at least partially overlap the color filter 230.

The color conversion layer 330 may include quantum dots, and the color conversion layer 330 may be configured to convert incident light into a different color. The color conversion layer 330 may include a green color conversion layer, a red color conversion layer, and a transmission layer. Blue light emitted from the light-emitting element layer 370 may be color-converted into green or red, respectively, or the blue light may be transmitted as it is.

The green color conversion layer may at least partially overlap a green color filter, the red color conversion layer may at least partially overlap a red color filter, and the transmission layer may at least partially overlap a blue color filter.

A planarization layer 350 may be disposed under the color conversion layer 330. The planarization layer 350 may be in contact with the encapsulation layer 390.

For example, in the display device according to an exemplary embodiment of the present invention, the display panel 100, including the light-emitting element layer 370, and the color conversion panel 300, including the color conversion layer 330, are combined. Blue light is emitted from the light-emitting element layer 370. The blue light is color-converted into red and green in each color conversion layer while passing through the color conversion layer 330, and is transmitted as blue in the transmission layer.

While the light passing through the color conversion layer 330 passes through each color filter again, color purity is increased. Also, the color filter 230 prevents light incident from the outside from being subject to color conversion in the color conversion layer 330.

As described above, in the display device, according to an exemplary embodiment of the present invention, the blue light emitted from the emission layer is emitted outside while passing through the color conversion layer and color filter, such that a display device with higher color purity may be provided.

However, the light that is color-converted in the color conversion layer 330 is emitted in all directions. Therefore, some of the color-converted light is emitted to the inside of the display device rather than to the outside, as is desired, and when the light emitted to the inside of the display device enters the transistor, it may affect the threshold voltage of the transistor.

Figure 2:
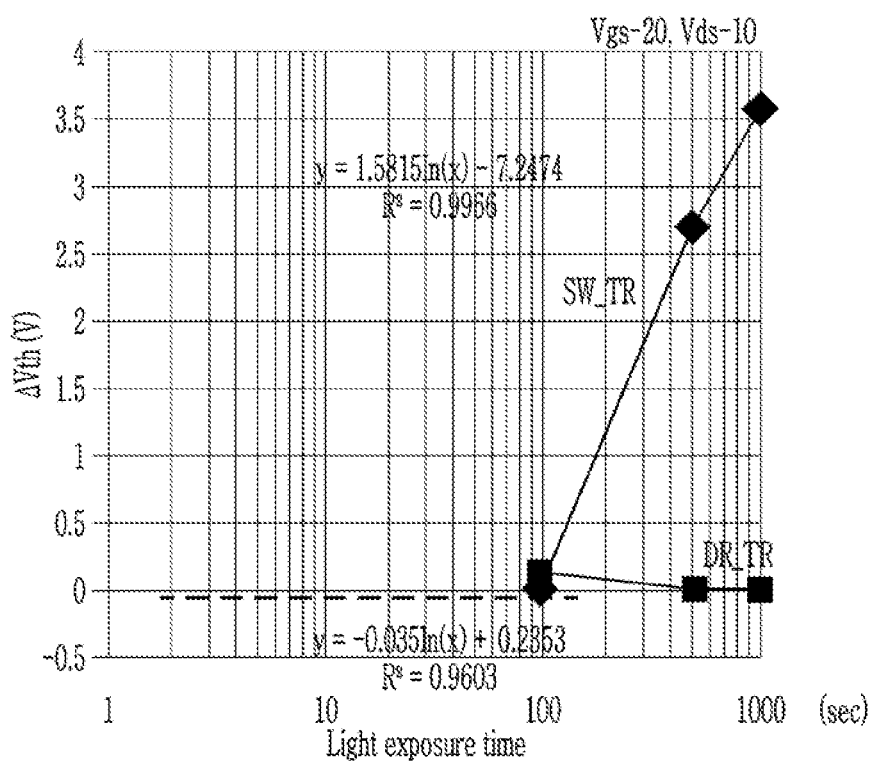
FIG. 2 is a graph illustrating a change amount (ΔVth) of a threshold voltage relating to a light exposure time.
Figure 3:
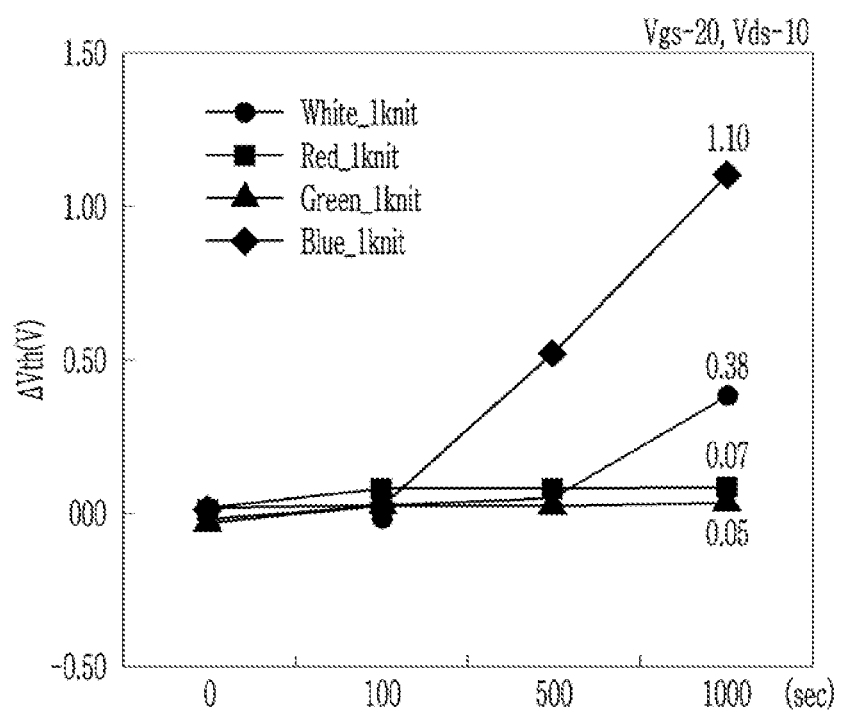
FIG. 3 is a graph illustrating a change amount (ΔVth) of a threshold voltage relating to a color of light.

FIG. 2 is a graph illustrating a change amount ($\Delta Vth$) of a threshold voltage with respect to a light exposure time. Referring to FIG. 2, the change amount ($\Delta Vth$) of the threshold voltage increases as the light exposure time increases in the switching transistor SW_TR. FIG. 3 is a graph illustrating a change amount ($\Delta Vth$) of a threshold voltage with respect to a color of light. Referring to FIG. 3, the change amount ($\Delta Vth$) of the threshold voltage appears largest when the blue light is incident.

In the case of a general organic light emitting diode (OLED) device without a color conversion layer, the light emitted from the light-emitting element layer 370 is mainly emitted in a front surface (in a direction away from the first substrate). The light emitted in the rear surface (in a direction towards to the first substrate) is reflected by the first electrode 191 and is again emitted to the front surface. Therefore, the light emitted from the light-emitting element layer 370 does not significantly affect the transistor.

However, in the case of the display device including the color conversion layer, the light emitted from the light-emitting element layer 370 is mainly emitted to the front surface, but the light that is color-converted in the color conversion layer 330 is emitted in all directions including to the front surface. Therefore, the light emitted from the color conversion layer 330 may be incident on the transistor such that the threshold voltage of the transistor is changed, and may reduce the reliability of the device.

However, in the display device, according to exemplary embodiments of the present invention, the insulating layer 180 disposed between the first electrode 191 and the first substrate 110 includes the first insulating layer 181 and the second insulating layer 182, and the first insulating layer 181 includes the material that does not transmit light. Thus, the light emitted to the rear surface in the color conversion layer 330 is blocked by the first insulating layer 181 and does not reach the transistor TFT. Therefore, the threshold voltage shift of the transistor TFT may be prevented.

The thickness of the first insulating layer 181 may be within a range of 2 μm to 4 μm. The thickness of the second insulating layer 182 may be within a range of 2 μm to 4 μm. Therefore, the thickness of the insulating layer 180 may be within a range of 4 μm to 8 μm.

If the thickness of the insulating layer formed through the coating is increased, it may be difficult to uniformly coat the insulating layer. Therefore, it is difficult to form the insulating layer over a predetermined thickness. Generally, the thickness of the insulating layer as a single layer is about 3 μm.

However, in the case of the display device, according to an exemplary embodiment of the present invention, the insulating layer 180 is a dual-layered structure of the first insulating layer 181 and the second insulating layer 182. Thus, since the insulating layer 180 is formed through two coating processes, the insulating layer 180 may be formed thick. If the insulating layer 180 is thickened, capacitance between the first electrode 191 and the underlying structure may be reduced, thereby increasing a degree of design freedom.

FIG. 1 illustrates a display device in a simplified manner, and illustrates the configuration in which the insulating layer 180 disposed between the first substrate 110 and the first electrode 191 blocks light. However, the light blocking layer is not limited to the insulating layer 180. The insulating layer disposed between the first electrode 191 and the first substrate 110 and disposed farther away from the first substrate 110 than the semiconductor layer of the transistor TFT may include the light blocking material without limitation.

FIG. 1 illustrates the configuration in which the insulating layer 180 includes the first insulating layer 181 for blocking light and the second insulating layer 182 for transmitting light. However, the entire insulating layer 180 may be configured for blocking light. Inclusion of the second insulating layer 182 transmitting light may provide better surface characteristic with the first electrode 191, and so it may be included. If the insulating layer includes the light blocking material, a surface adhesion characteristic may vary, but the surface adhesion characteristic is not reduced for a conventional insulating layer that does not include the light blocking material.

Next, the display panel according to an exemplary embodiment of the present invention is described in detail with reference to the detailed drawings. Hereinafter, the configuration of the display panel 100 is described and the configuration of the color conversion panel 300 is the same as that of FIG. 1.

Figure 4:
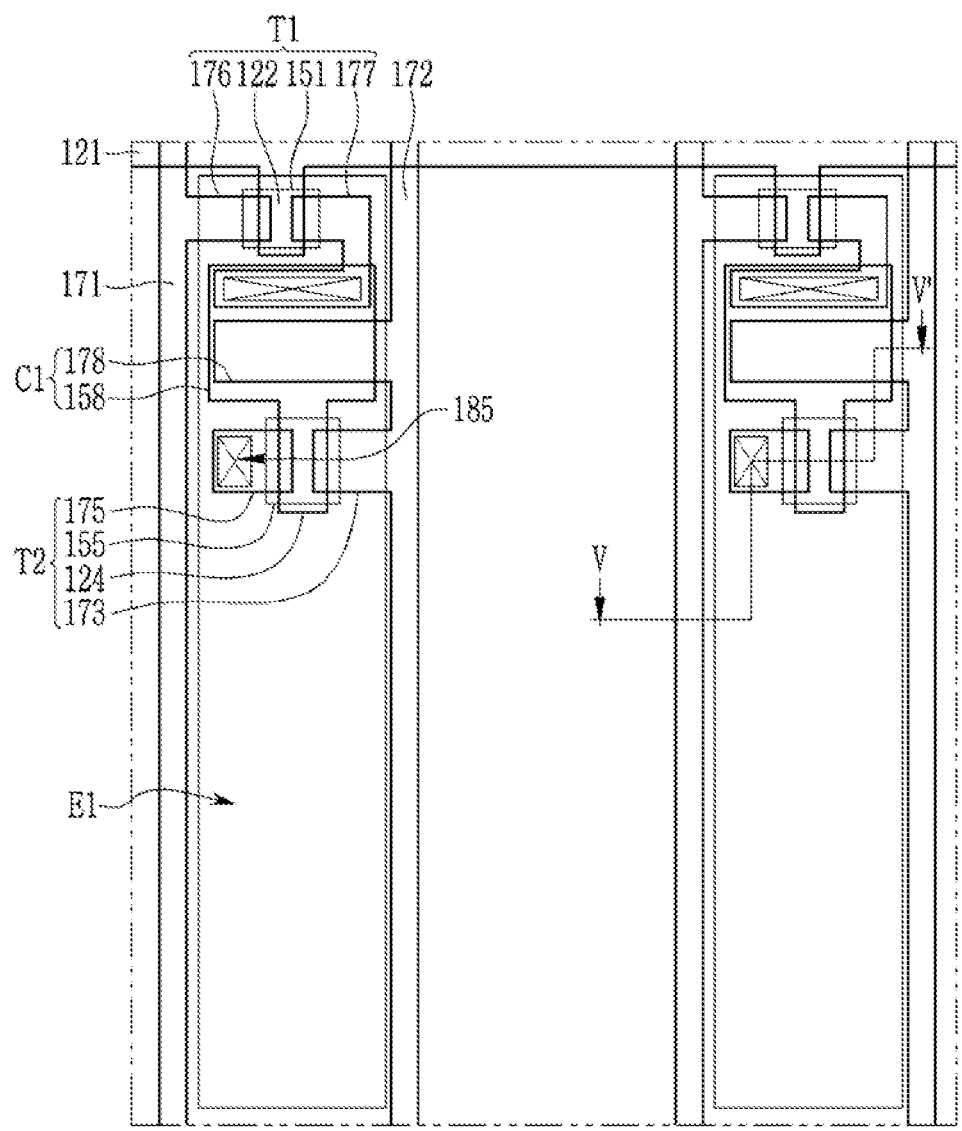
FIG. 4 is a top plan view schematically illustrating a display panel according to an exemplary embodiment of the present invention.
Figure 5:
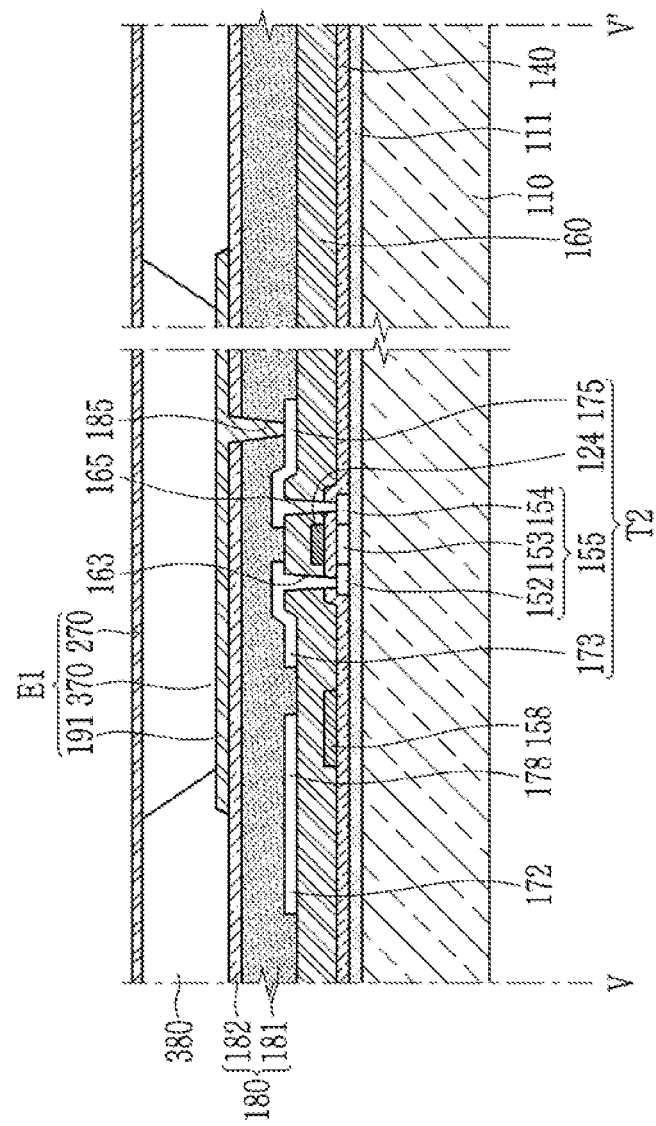
FIG. 5 is a cross-sectional view taken along a line V-V' of FIG. 4.

FIG. 4 is a top plan view schematically illustrating a display panel according to an exemplary embodiment of the present invention. FIG. 5 is a cross-sectional view taken along a line V-V' of FIG. 4, In the drawings, an active matrix (AM) light emitting display device of a 2Tr-1Cap structure in which each pixel of the display area includes two thin film transistors (TFT) T1 and T2 and one capacitive element C1 is shown, however the present invention is not limited thereto. Accordingly, the light emitting device may provide three or more transistors and two or more capacitive elements in one pixel, and separate wiring may be further formed such that it may have various structures. Here, the pixel is a minimum unit for displaying an image, and the display area displays the image through the plurality of pixels.

Referring to FIG. 4 and FIG. 5, the emissive display device, according to exemplary embodiments of the present invention, includes a switching thin film transistor T1, a driving thin film transistor T2, a capacitive element C1, and a light-emitting element E1 which are respectively formed in a plurality of pixels disposed on the substrate 110. On the substrate 110, a gate line 121 is disposed along one direction, and a data line 171 and a common power line 172 crossing the gate line 121, are disposed. Here, each pixel may be defined by boundaries of the gate line 121, the data line 171, and the common power line 172, but the present invention is not limited thereto.

The organic light emitting element E1 includes a first electrode 191, a light-emitting element layer 370 formed on the first electrode 191, and a second electrode 270 formed on the light-emitting element layer 370.

Here, the first electrode 191 becomes an anode that is a hole injection electrode and the second electrode 270 becomes a cathode that is an electron injection electrode. However, the present invention is not limited thereto, and the first electrode 191 may become the cathode and the second electrode 270 may become the anode depending on a driving method of the emissive display device. The first electrode 191 may be a pixel electrode, and the second electrode 270 may be a common electrode.

The light-emitting element layer 370 may include a hole injection layer, a hole transport layer, an emission layer, an electron transport layer, and/or an electron injection layer. The emission layer may an organic emission layer, and the injected holes and electrons are combined with each other so as to form excitons. When the excitons drop from an excited state to a ground state, the emission of light occurs. Also, the emission layer may include quantum dots so as to generate a desired light spectrum.

The capacitive element C1 includes a pair of capacitive plates 158 and 178. An interlayer insulating layer 160 may be interposed between the capacitive plates 158 and 178. Here, the interlayer insulating layer 160 becomes a dielectric material. A capacitance is determined by charge in the capacitive element C1 and a voltage between the pair of capacitive plates 158 and 178.

The switching thin film transistor T1 includes a switching semiconductor layer 151, a switching gate electrode 122, a switching source electrode 176, and a switching drain electrode 177. The driving thin film transistor T2 includes a driving semiconductor layer 155, a driving gate electrode 124, a driving source electrode 173, and a driving drain electrode 175.

The switching thin film transistor T1 is used as a switching element for switching the pixel to be emitted. The switching gate electrode 122 is connected to the gate line 121, and the switching source electrode 176 is connected to the data line 171. The switching drain electrode 177 is separated from the switching source electrode 176, and is connected to one capacitive plate 158.

The driving thin film transistor T2 applies driving power for emitting the light-emitting element layer 370 of the organic light emitting element E1 within the switched pixel to the first electrode 191. The driving gate electrode 124 is connected to the capacitive plate 158 connected to the switching drain electrode 177. The driving source electrode 173 and the other capacitive plate 178 are respectively connected to the common power line 172.

The driving drain electrode 175 is connected to the first electrode 191 through a contact hole 185.

The organic light emitting device, according to an exemplary embodiment of the present invention, will now be described in detail with reference to FIG. 5 along with FIG. 4.

A buffer layer 111 is disposed on the first substrate 110. The substrate 110 may be made of glass, quartz, ceramic, plastic, etc. The buffer layer 111 may be made of a silicon nitride (SiNx), a silicon oxide (SiOx), a silicon oxynitride (SiOxNy), etc., however it is not limited thereto. Herein, x and y may each represent an integer from 1 to 5.

The driving semiconductor layer 155 is disposed on the buffer layer 111. The driving semiconductor layer 155 may be made of various semiconductor materials such as a polycrystalline silicon and amorphous silicon. The driving semiconductor layer 155 may include a source region 152, a channel region 153, and a drain region 154.

A gate insulating layer 140 made of a silicon nitride or a silicon oxide is positioned on the driving semiconductor layer 155. The driving gate electrode 124 and the first capacitive plate 158 are disposed on the gate insulating layer 140. In this case, the driving gate electrode 124 overlaps at least part of the driving semiconductor layer 155, for example, the channel region 153.

The interlayer insulating layer 160 covering the gate insulating layer 140 is disposed on the driving gate electrode 124. The interlayer insulating layer 160 may be formed of a silicon nitride or a silicon oxide, like the gate insulating layer 140. The gate insulating layer 140 and the interlayer insulating layer 160 have a first contact hole 163 and a second contact hole 165 respectively exposing the source region 152 and the drain region 154 of the driving semiconductor layer 155.

The driving source electrode 173, the driving drain electrode 175, the data line 171, the common power line 172, and the second capacitive plate 178 are disposed on the interlayer insulating layer 160. The driving source electrode 173 and the driving drain electrode 175 are respectively connected to the source region 152 and the drain region 154 of the driving semiconductor layer 155 through the first contact hole 163 and the second contact hole 165, respectively.

The insulating layer 180 covering the driving source electrode 173 and the driving drain electrode 175 is disposed on the interlayer insulating layer 160. The insulating layer 180 may include an organic material such as a polyacrylic series, a polyimide series, etc.

The insulating layer 180 includes the first insulating layer 181 and the second insulating layer 182, and the first insulating layer 181 includes the material that does not transmit light. For example, the first insulating layer 181 may include the black matrix material. The second insulating layer 182 is transparent and may transmit light.

The first insulating layer 181 is disposed closer to the first substrate 110 than the second insulating layer 182. Since the first insulating layer 181 does not transmit light, the light emitted from the light-emitting element layer 370 and the light emitted from the color conversion layer 330 disposed in the color conversion panel 300 may be prevented from being incident on the driving semiconductor layer 155 and the switching semiconductor layer 151. Therefore, the threshold voltage shift due to light exposure of the driving semiconductor layer 155 and the switching semiconductor layer 151 may be prevented.

The insulating layer 180 has the contact hole 185. The first electrode 191 is disposed on the insulating layer 180. The first electrode 191 may be the pixel electrode. The first electrode 191 is connected to the driving drain electrode 175 through the contact hole 185.

The partition wall 380 is disposed on the insulating layer 180, and the part of the partition wall 380 is removed or omitted, thereby defining the opening. In the opening, the light-emitting element layer 370 overlaps the first electrode 191, and the second electrode 270 overlaps the light-emitting element layer 370. The light-emitting element layer 370 may include the hole injection layer, the hole transport layer, the emission layer, the electron transport layer, and/or the electron injection layer. The second electrode 270 may be the common electrode. The light-emitting element E1 includes the first electrode 191, the light-emitting element layer 370, and the second electrode 270.

The first electrode 191 may have a triple-layered structure of a transparent conductive oxide/a metal/a transparent conductive oxide. When the first electrode 191 includes the metal, the light emitted from the light-emitting element layer 370 is reflected by the first electrode 191 and is emitted to the front surface. For example, the first electrode 191 may have a structure of ITO/Ag/ITO.

In this case, the thickness of the Ag layer may be 500 Å to 1500 Å. When the Ag layer becomes thick, the first electrode 191 blocks light such that the amount of light incident to the semiconductor layer may be reduced. As the Ag layer increases in thickness, the surface roughness increases and the reflectance decreases. As an experimental result, the reflectance is 296,700 $cd/m^2$ when the thickness of the Ag is 1000 Å, but the reflectivity is decreased to 276,400 $cd/m^2$ when the thickness of the Ag is 3000 Å. Thus it may not be desirable to increase the thickness of the Ag layer.

Therefore, when the thickness of the Ag layer is above 1500 Å, the reflectance decreases and the efficiency of the display device decreases due to the increased surface roughness. However, when the thickness of the Ag layer is less than 1500 Å, the light emitted from the light-emitting element layer 370 may be transmitted through the first electrode 191 and be incident into the semiconductor layer. In this case, the threshold voltage of the semiconductor layer changes and the reliability of the device may be reduced.

However, in the case of the display device, according to an exemplary embodiment of the present invention, since the insulating layer 180 is disposed between the first electrode 191 and the semiconductor layer including the first insulating layer 181 that is configured to block light, the first insulating layer 181 may prevent light passing through the first electrode 191 from being incident to the semiconductor layer.

Figure 6:
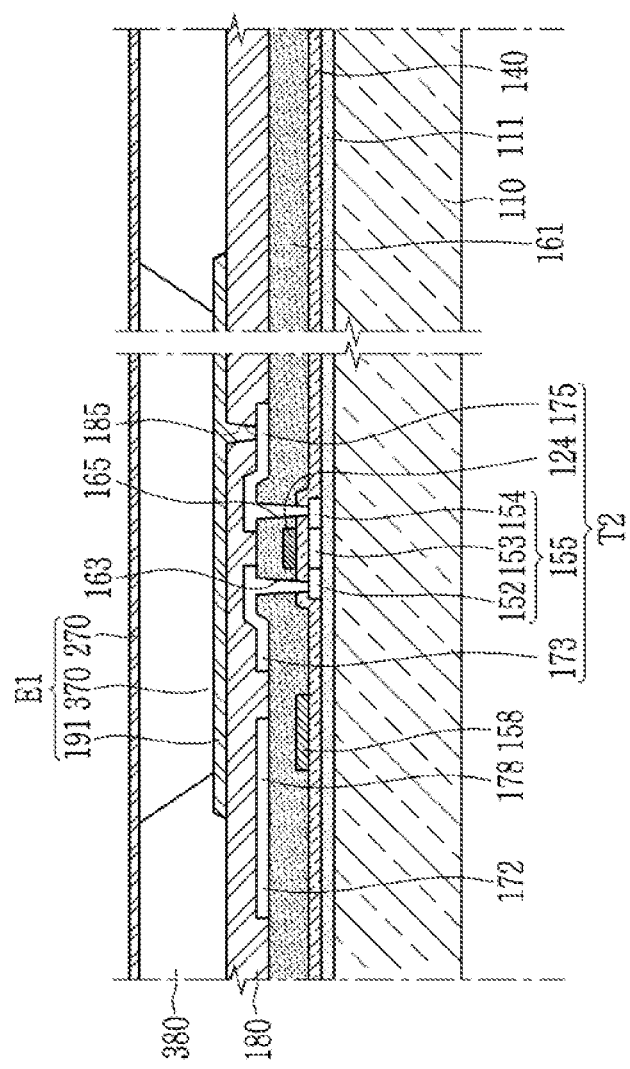
FIG. 6 is a cross-sectional view taken along a line V-V' of FIG. 4 in a display device according to an exemplary embodiment of the present invention.

Next, a display device according to an exemplary embodiment of the present invention is described. FIG. 6 is a cross-sectional view taken along a line V-V' in a display device according to an exemplary embodiment of the present invention. Referring to FIG. 6, the display device, according to an exemplary embodiment of the present invention, has a different configuration of the insulating layer 180 and a light blocking insulating layer 161 from what is shown in FIG. 5. The detailed description for the same constituent elements is omitted.

Referring to FIG. 6, in the display device, according to exemplary embodiments of the present invention, the insulating layer 180 is a single layer. However, instead of having the interlayer insulating layer 160 of FIG. 5, the light blocking insulating layer 161 is disposed as shown in FIG. 6. The light blocking insulating layer 161 includes the light blocking material, so the light emitted from the light-emitting element layer 370 and the color conversion layer 330 is prevented from being incident to the semiconductor layer.

Here, the insulating layer 180 may include the light blocking material. When the insulating layer 180 includes the light blocking material, the light blocking effect increases, and when the insulating layer 180 does not include the light blocking material, the surface adhesion characteristic with the first electrode 191 may be excellent.

In the display panel, as illustrated in FIG. 5, the interlayer insulating layer 160 includes the inorganic material, however the display panel shown in FIG. 6 includes the light blocking insulating layer 161 of the organic material instead of the interlayer insulating layer 160 of the inorganic material. Therefore, when the display panel is applied to a flexible display device or the like, the light blocking insulating layer 161 may be flexibly bent without cracking or breaking.

Figure 7:
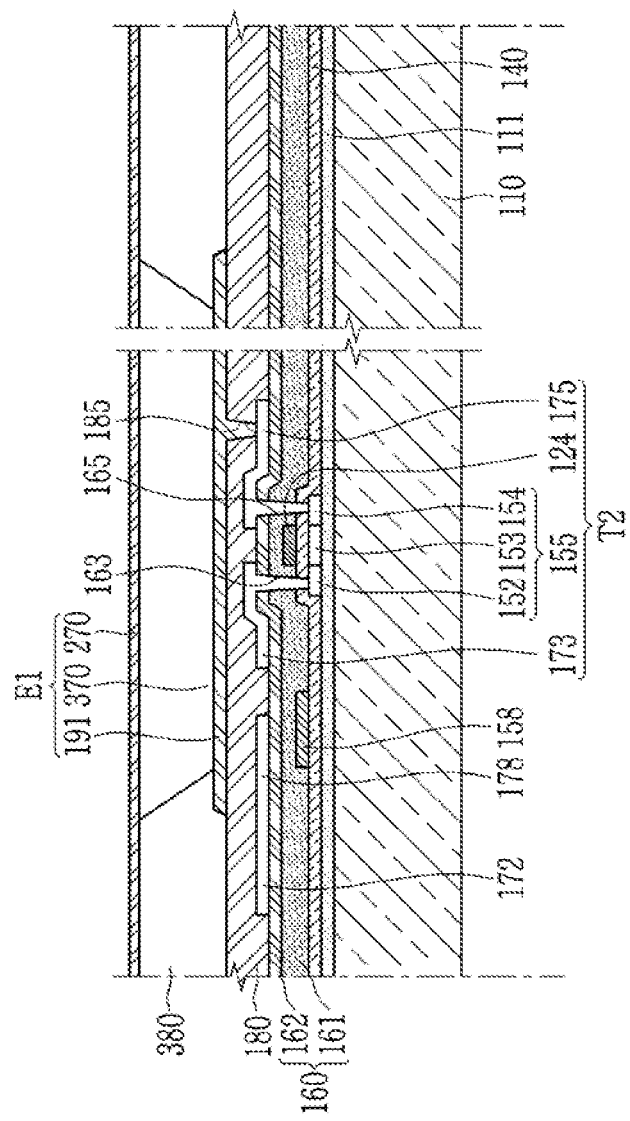
FIG. 7 is a cross-sectional view taken along a line V-V' of FIG. 4 in a display device according to an exemplary embodiment of the present invention.

FIG. 7 is a cross-sectional view taken along a line V-V'. In the approach of FIG. 7, the configuration of the interlayer insulating layer 160 is different from what is shown above. The detailed description for the same constituent elements is omitted.

Referring to FIG. 7, in the display device, according to exemplary embodiments of the present invention, the interlayer insulating layer 160 is formed of the dual layer of the light blocking insulating layer 161 and a light transmissive insulating layer 162. The light blocking insulating layer 161 blocks light incident from the light-emitting element layer 370 and the color conversion layer 330, like in FIG. 6. Also, the light transmissive insulating layer 162 transmits light and provides for excellent surface adhesion with the data line 171 and the common power line 172, which are described later.

Figure 8:
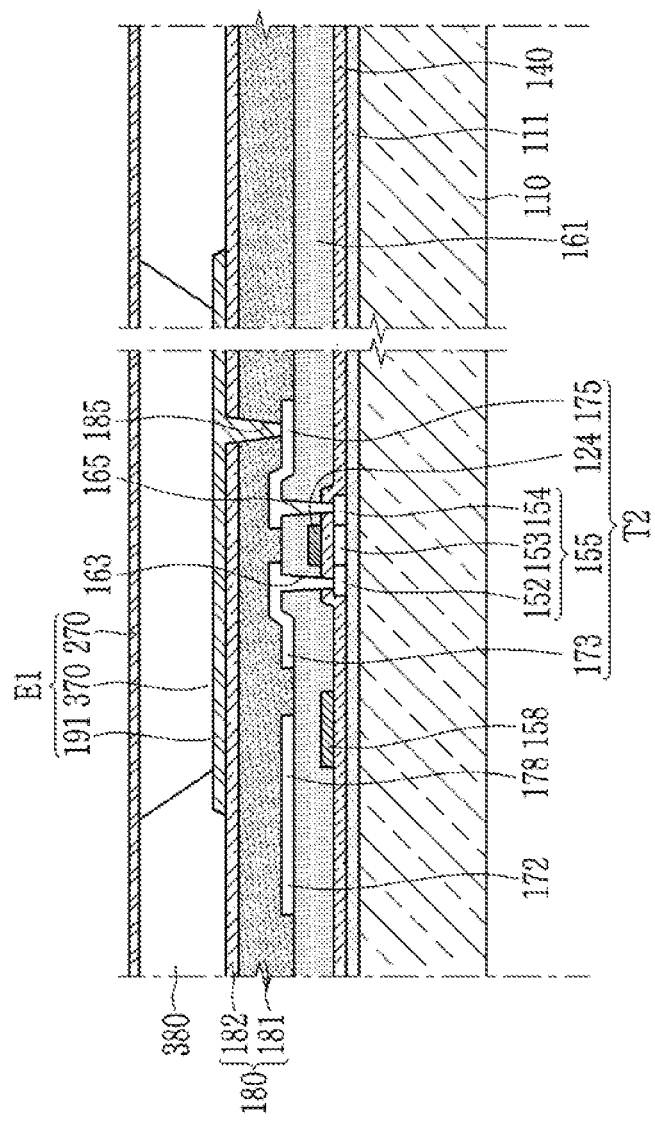
FIG. 8 is a cross-sectional view taken along a line V-V' of FIG. 4 in a display device according to an exemplary embodiment of the present invention.

FIG. 8 is a cross-sectional view taken along a line V-V' showing a different configuration of the light blocking insulating layer 161. The detailed description for the same constituent elements is omitted.

In the display panel of FIG. 8, the light blocking insulating layer 161 is disposed instead of the interlayer insulating layer 160 of FIG. 5. The light blocking insulating layer 161 includes the light blocking material, and accordingly, the light emitted from the light-emitting element layer 370 and the color conversion layer 330 is prevented from being incident to the semiconductor layer. In the case of FIG. 8, since the light emitted from the light-emitting element layer 370 and the color conversion layer 330 is blocked once by the first insulating layer 181 and then blocked again by the light blocking insulating layer 161, it is possible to more effectively prevent light from entering the semiconductor layer.

Figure 9:
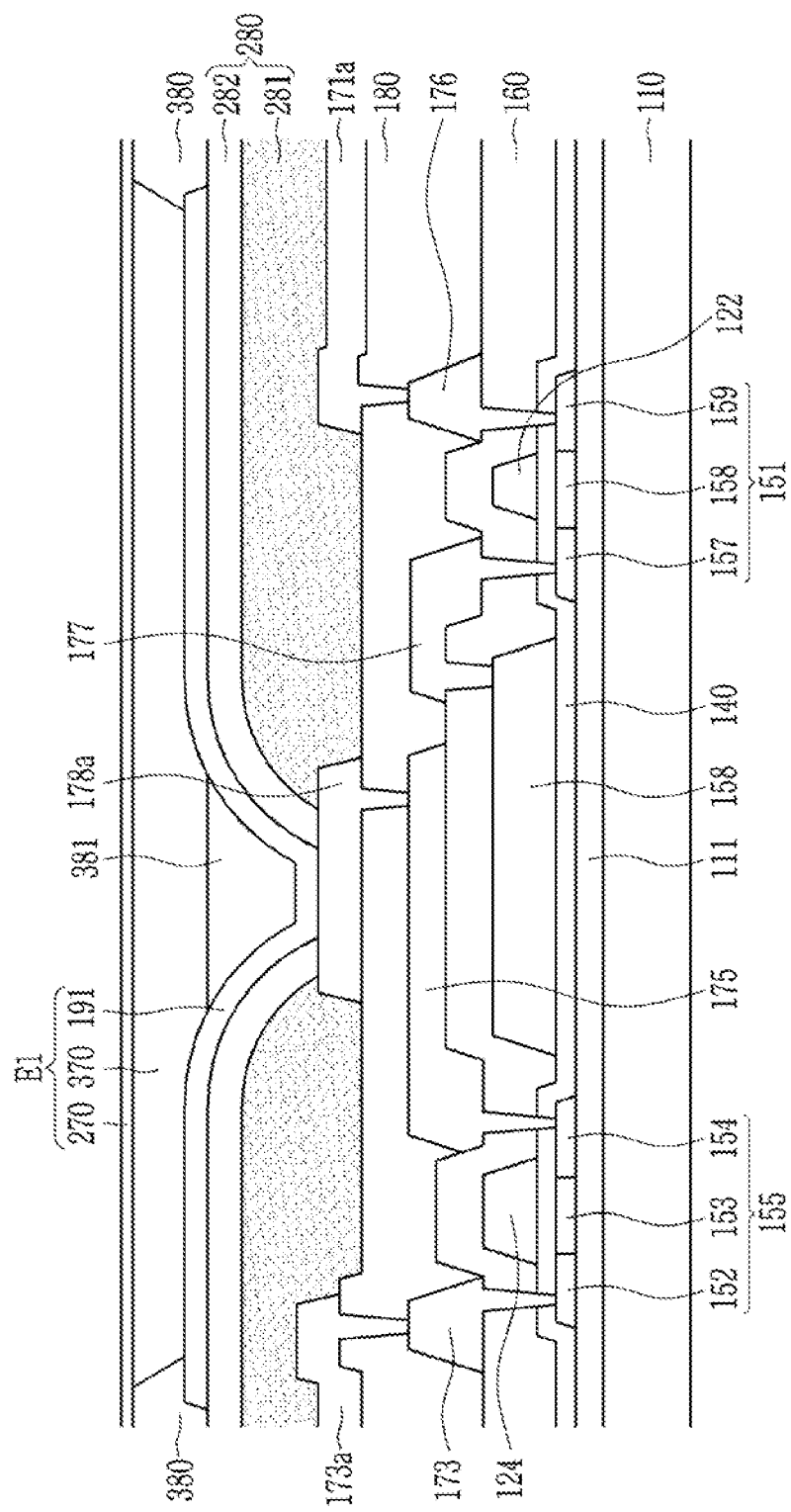
FIG. 9 is a cross-sectional view illustrating a display device according to an exemplary embodiment of the present invention.

Hereinafter, the display panel according to an exemplary embodiment of the present invention will be described with reference to FIG. 9. The main features of the display panel of FIG. 9 are similar to the features of the display panel of FIG. 4 to FIG. 8. However, the stacked structure of the display panel of FIG. 9 is partially different from the structures of FIG. 4 to FIG. 8. Hereinafter, the exemplary embodiment of FIG. 9 is described based on differences from FIG. 4 to FIG. 8.

Referring to FIG. 9, the display device, according to an exemplary embodiment of the present invention, includes the first substrate 110, the buffer layer 111, the driving semiconductor layer 155, the switching semiconductor layer 151, the gate insulating layer 140, the gate conductor including the driving gate electrode 124, the switching gate electrode 122, and the capacitive plate 158, and the data conductor including the driving source electrode 173, the driving drain electrode 175, the switching source electrode 176, and the switching drain electrode 177, and the description thereof is the same as that in FIG. 4 to FIG. 8. The detailed description for the same constituent elements is omitted.

Referring to FIG. 9, a voltage transmitting conductor is disposed on the data conductor including the driving source electrode 173, the driving drain electrode 175, the switching source electrode 176, and the switching drain electrode 177.

The voltage transmitting conductor includes an ELVDD line 173a overlapping and connected to the driving source electrode 173, a data voltage line 171a overlapping and connected to the switching source electrode 176, and a connection electrode 178a overlapping and connected to the driving drain electrode 175.

A pixel insulating layer 280 is disposed on the voltage transmitting conductor. The pixel insulating layer 280 includes a first pixel insulating layer 281 and a second pixel insulating layer 282. The first pixel insulating layer 281 is disposed closer to the first substrate 110 than the second pixel insulating layer 282 is.

The thickness of the first pixel insulating layer 281 may be within a range of 2 μm to 4 μm. Also, the thickness of the second pixel insulating layer 282 may be within a range of 2 μm to 4 μm. The entire thickness of the pixel insulating layer 280 may be within a range of 4 μm to 8 μm.

The first pixel insulating layer 281 includes the material that does not transmit light. Accordingly, the light emitted from the light-emitting element layer 370 is prevented from being incident on the semiconductor layer. The second pixel insulating layer 282 may transmit light. The second pixel insulating layer 282 increases the surface adhesion with the first electrode 191 disposed thereafter.

The pixel insulating layer 280 of the region overlapping the connection electrode 178a is removed such that part of the connection electrode 178a is not covered by the pixel insulating layer 280.

The connection electrode 178a may include a metal of the triple-layered structure. For example, a metal of a Ti/Al/Ti structure may be included, and the thickness of each layer may be 300 Å/6000 Å/700 Å. However, this is merely an example, and the present invention is not limited thereto. The connection electrode 178a may have the thickness of 7000 Å or more. Thus, the connection electrode 178a may block the light even if it is not covered by the pixel insulating layer 280.

Next, the first electrode 191 is disposed on the pixel insulating layer 280. The first electrode 191 is in contact with the connection electrode 178a of a region that is not covered by the pixel insulating layer 280 to receive a voltage. The first electrode 191 may be the pixel electrode.

The partition wall 380 is disposed on the first electrode 191. The pixel insulating layer 280 is removed in the region where the first electrode 191 and the connection electrode 178a are in contact with each other such that a concave groove is formed. The planarization layer 381, including the same material as the partition wall 380, is disposed on the pixel electrode 191 of the groove. The planarization layer 381 compensates for, and thus planarizes, the step of the first electrode 191 to dispose the light-emitting element layer 370 on a flat surface.

The light-emitting element layer 370 is disposed on the first electrode 191. The light-emitting element layer 370 may include the hole injection layer, the hole transport layer, the emission layer, the electron transport layer, and/or the electron injection layer.

The second electrode 270 is disposed on the light-emitting element layer 370. The second electrode 270 may be the common electrode.

For example, in the case of the display device of FIG. 9, the voltage transmitting conductor layer is disposed on the insulating layer 180, the pixel insulating layer 280 is disposed between the voltage transmitting conductor layer and the first electrode 191, and the pixel insulating layer 280 includes the first pixel insulating layer 281 that is configured for blocking light. Accordingly, light emitted from the light-emitting element layer 370 and the color conversion layer 330 may be prevented from being incident to the semiconductor layer. FIG. 9 shows the configuration in which the pixel insulating layer 280 includes the light blocking layer, but additionally, the insulating layer 180 and the interlayer insulating layer 160 may also include the light blocking layer.

Next, a process for manufacturing the display panel, according to exemplary embodiments of the present invention, is described with reference to FIG. 10 to FIG. 15 based on the forming process of the pixel insulating layer 280. FIG. 10 to FIG. 15 are process cross-sectional views for manufacturing the display panel of FIG. 9.

Figure 10:
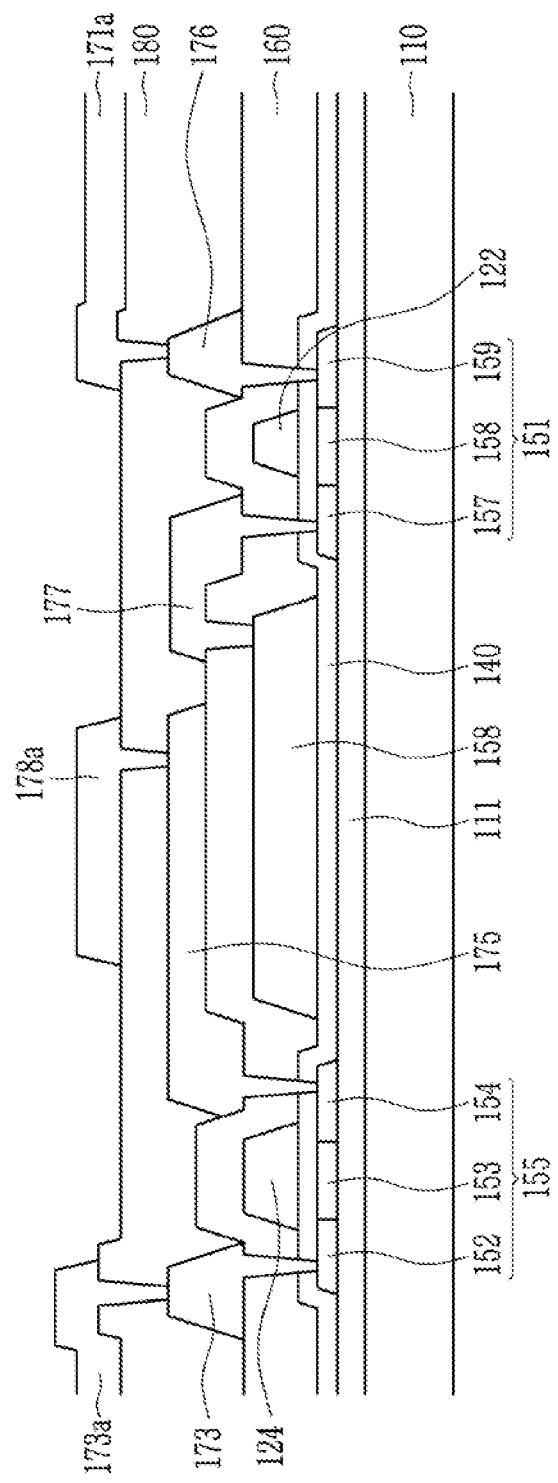
FIG. 10 to FIG. 15 are cross-sectional views illustrating a process for manufacturing the display panel of FIG. 9.

Referring to FIG. 10, the first substrate 110 is formed. The buffer layer 111 is formed on the first substrate 110. The semiconductor layer, including the driving semiconductor layer 155 and the switching semiconductor layer 151, is then formed on the buffer layer 111. The gate insulating layer 140 is then formed covering both the semiconductor layer and the buffer layer 111. The gate conductor, including the driving gate electrode 124, the switching gate electrode 122, and the capacitive plate 158, are then formed over the gate insulating layer 140. The data conductor, including the driving source electrode 173, the driving drain electrode 175, the switching source electrode 176, and the switching drain electrode 177, are formed on the gate conductor. The voltage transmitting conductor, including the ELVDD line 173a overlapping the driving source electrode 173 to be connected to each other, the data voltage line 171a overlapping the switching source electrode 176 to be connected to each other, and the connection electrode 178a overlapping the driving drain electrode 175 to be connected to each other, are formed on the data conductor. The display panel manufacturing process of FIG. 10 may be prepared by a general method in the art.

Figure 11:
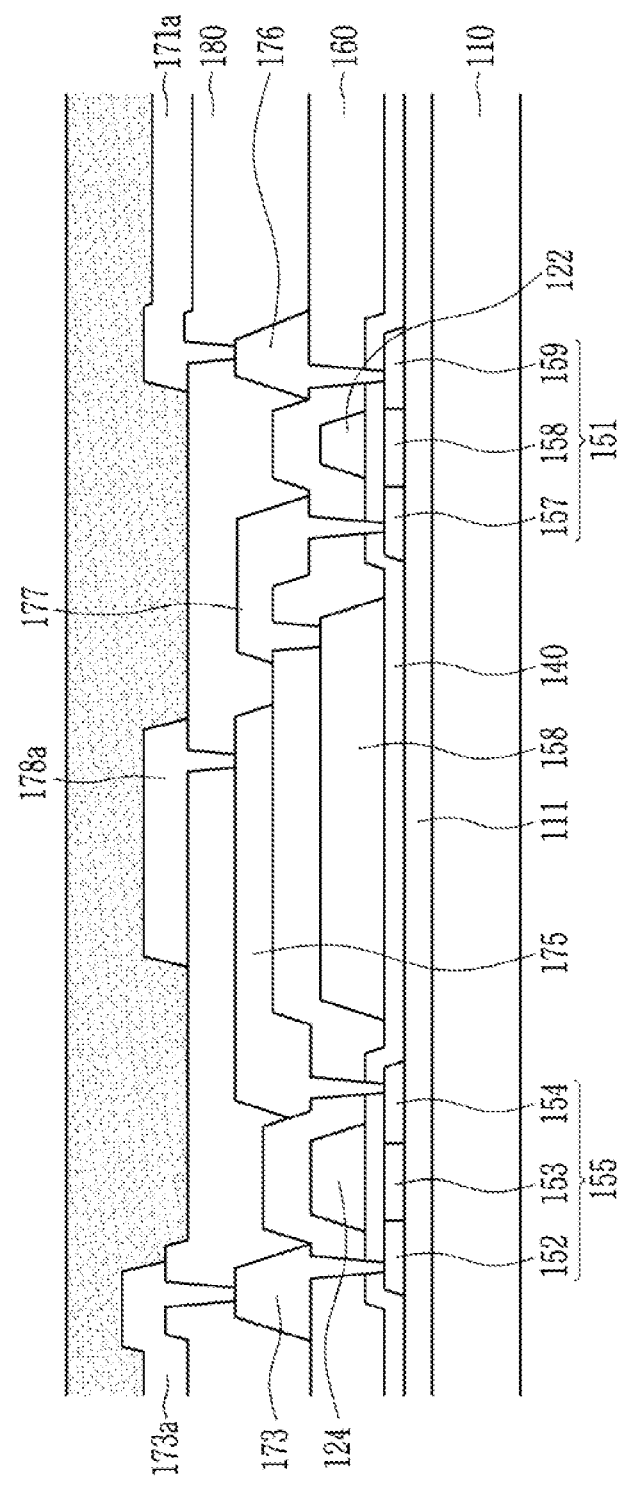

Next, referring to FIG. 11, the first pixel insulating layer 281, including the light blocking material, is coated on the entire surface of the display panel. In this case, the first pixel insulating layer 281 may include the same material as the light blocking member.

Figure 12:
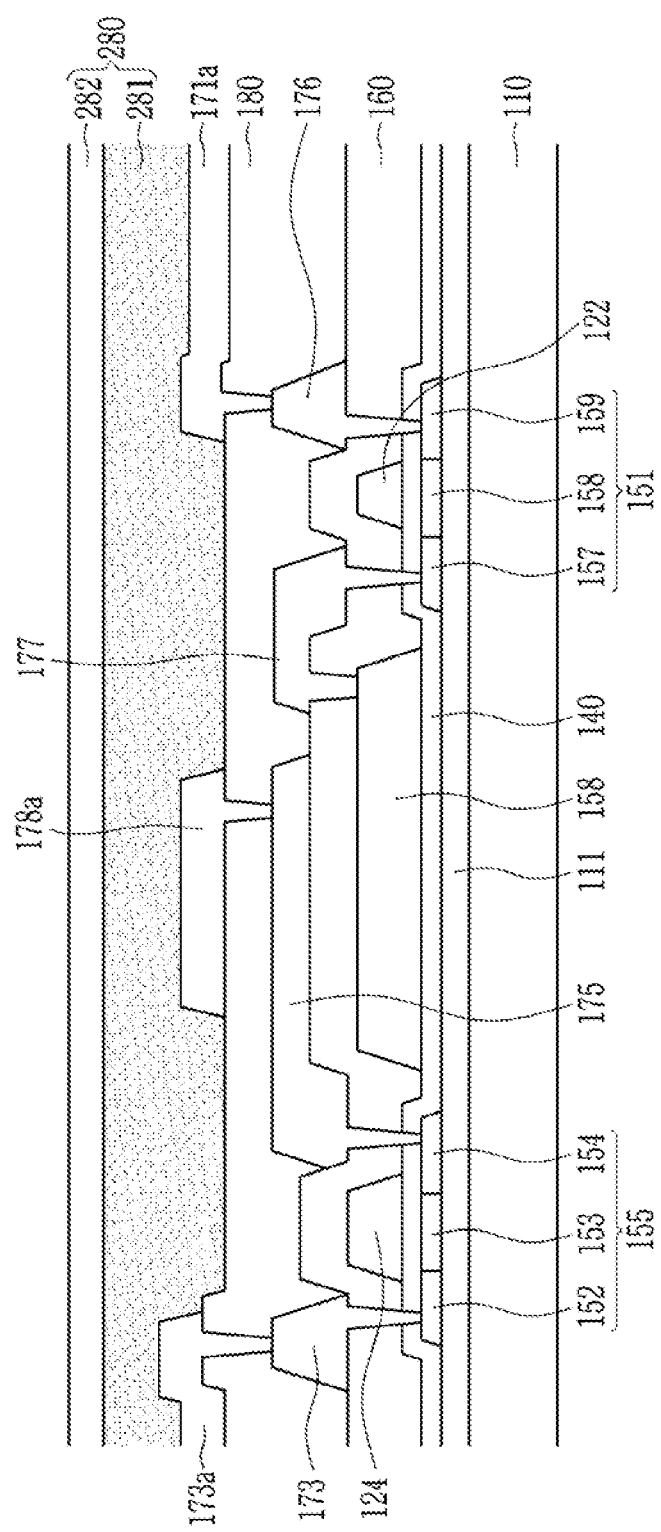

Next, referring to FIG. 12, the second pixel insulating layer 282 is formed. The second pixel insulating layer 282 may be transparent.

Figure 13:
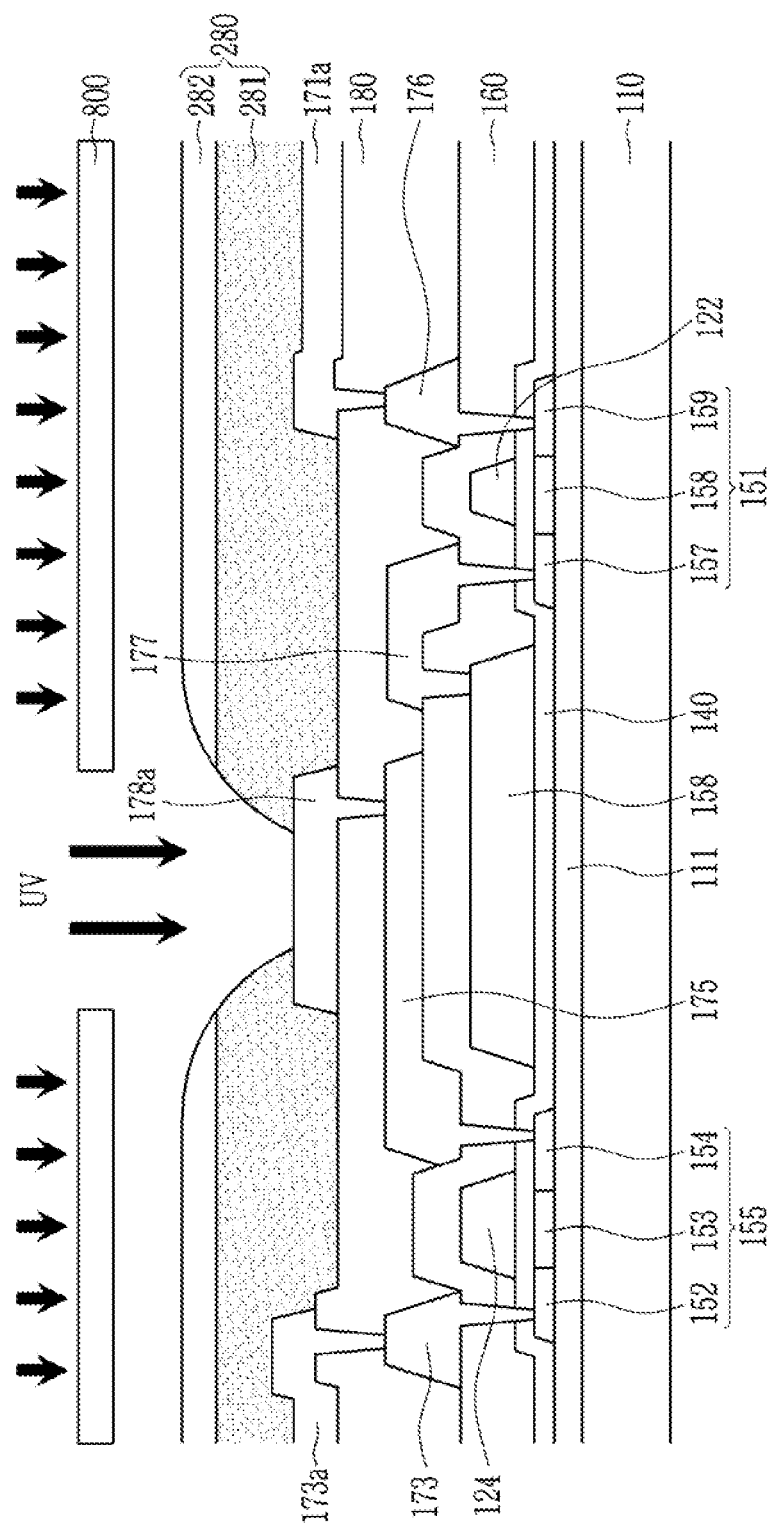

Next, referring to FIG. 13, the pixel insulating layer 280 is patterned, for example with ultraviolet (UV) light, by using a mask 800. The first pixel insulating layer 281 and the second pixel insulating layer 282 are patterned by a single process using one mask. The pixel insulating layer 280 overlapping the connection electrode 178a is removed through a patterning process such that the connection electrode 178a is exposed. Since the first pixel insulating layer 281 and the second pixel insulating layer 282 are patterned by the single process using one mask, the edge of the first pixel insulating layer 281 and the edge of the second pixel insulating layer 282 may be disposed on the same line in the opening.

Figure 14:
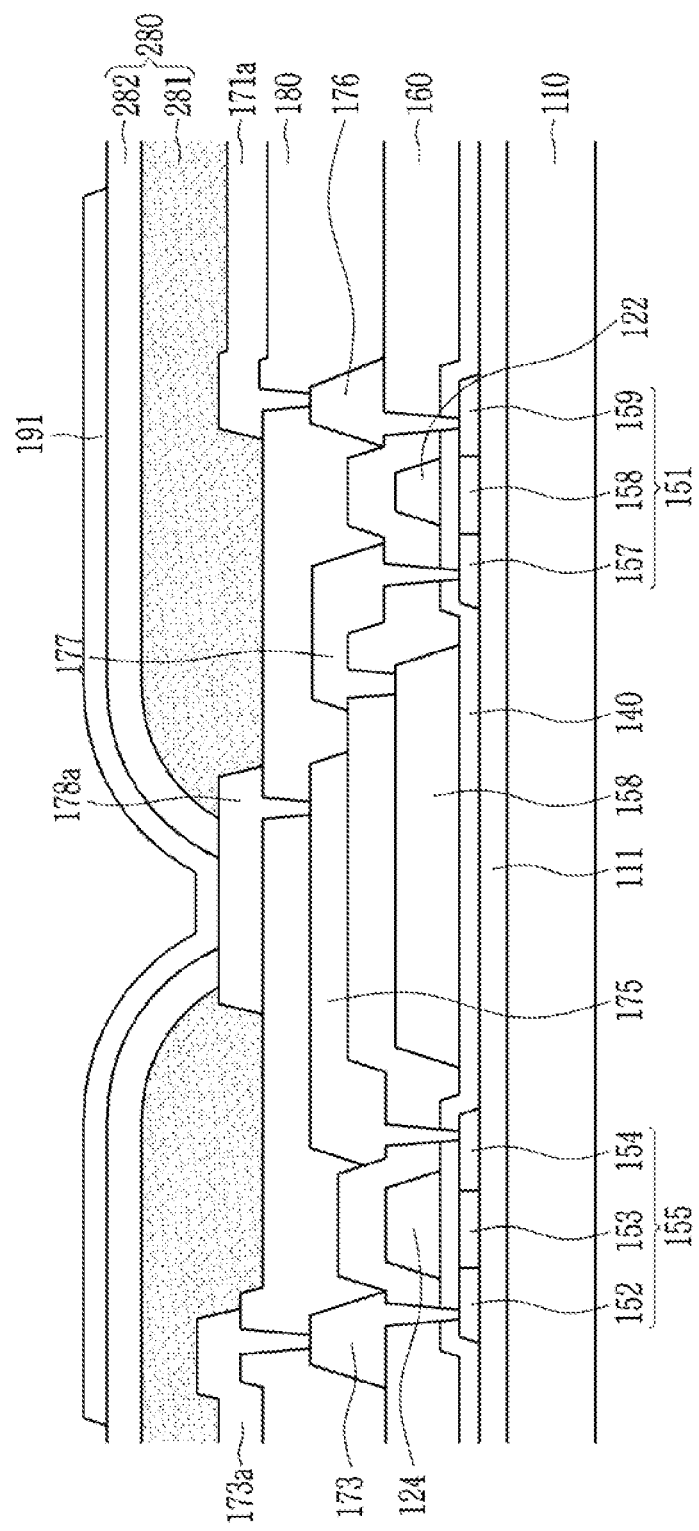

Next, referring to FIG. 14, the first electrode 191 is formed on the pixel insulating layer 280. The first electrode 191 is in contact with the connection electrode 178a in the opening of the pixel insulating layer 280.

Figure 15:
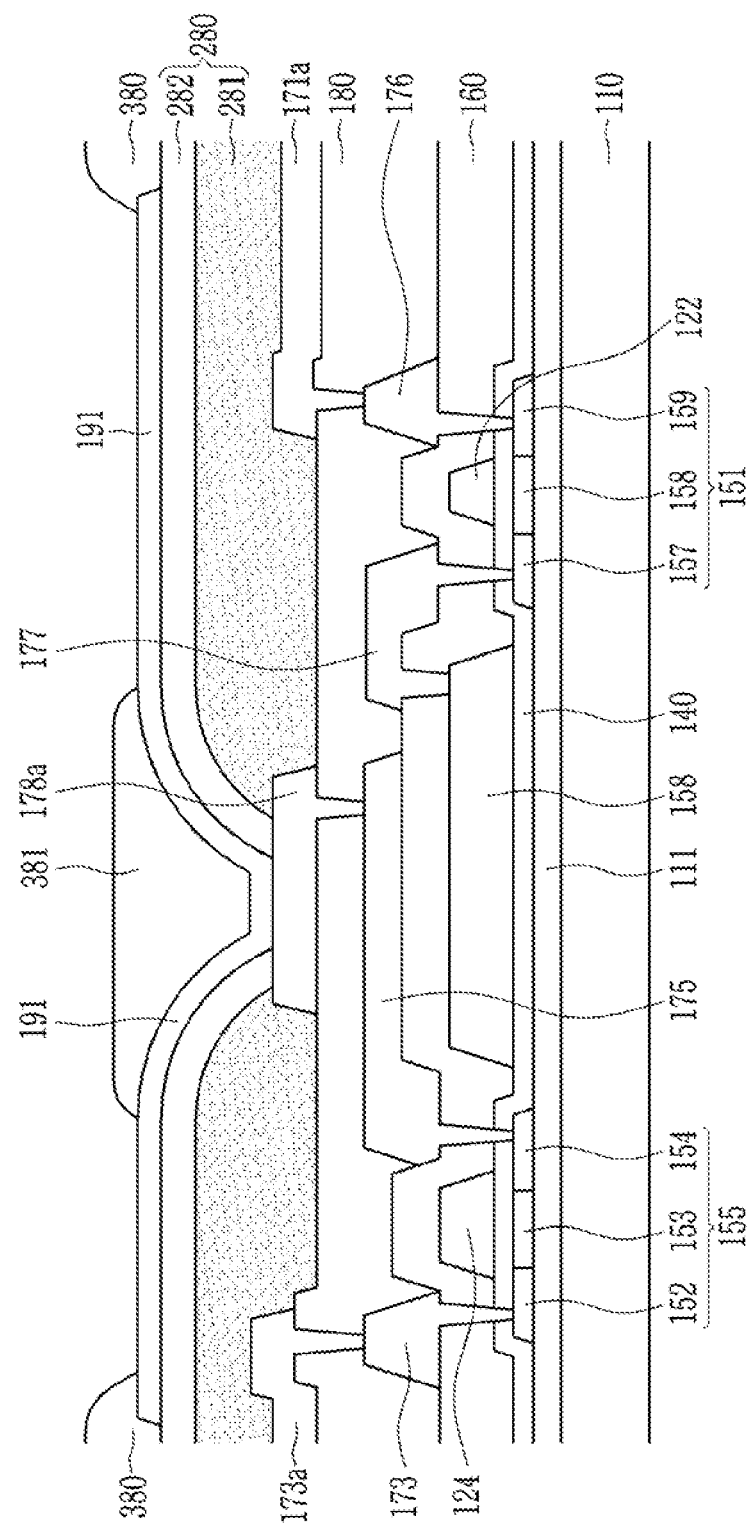

Next, referring to FIG. 15, the partition wall 380 and the planarization layer 381 are formed. The partition wall 380 overlaps the part of the first electrode 191, and is formed primarily in the region where the first electrode 191 is not formed. The planarization layer 381 flattens and planarizes the step due to the opening while overlapping the opening of the pixel insulating layer 280 under the pixel insulating layer 280. The partition wall 380 and the planarization layer 381 may be formed by the single process with one patterning process after entirely coating the partition wall material.

Next, as shown in FIG. 9, the light-emitting element layer 370 and the second electrode 270 are formed, thereby manufacturing the display panel.

FIG. 10 to FIG. 15 describe the method for manufacturing the display panel in which the pixel insulating layer 280 includes the first pixel insulating layer 281 and the second pixel insulating layer 282, however the insulating layer 180, the interlayer insulating layer 160, etc. may be manufactured by a similar method to the manufacturing method of the pixel insulating layer 280. For example, when the insulating layer 180 has the dual-layered structure of the first insulating layer 181 and the second insulating layer 182, as shown in FIG. 10 to FIG. 15, the first insulating layer 181 and the second insulating layer 182 are sequentially coated and may be formed by the patterning process using one mask. Likewise, when the interlayer insulating layer 160 has the dual-layered structure of the light blocking insulating layer 161 and the light transmissive insulating layer 162, the light blocking insulating layer 161 and the light transmissive insulating layer 162 are sequentially coated and may be formed by the patterning process using one mask.

Therefore, a separate patterning process is not required and the manufacturing process can be simplified.

As above-described, the display device, according to an exemplary embodiment of the present invention, includes the display panel including the light-emitting element and the color conversion panel in which the color filter and the color conversion layer are disposed. Therefore, the color purity of the display device may be increased while emitting the light from the light-emitting element through the color conversion layer and the color filter.

However, since the light converted in the color conversion layer is emitted in all directions and the blue light having high energy is emitted in the light-emitting element, this light is incident to the semiconductor layer such that the threshold voltage of the semiconductor layer may be shifted. However, as the insulating layer disposed between the semiconductor layer and the first electrode includes the light blocking insulating layer in the display device, according to exemplary embodiments of the present intention, the light emitted in the light-emitting element layer or the color conversion layer is prevented from being incident to the semiconductor layer. Accordingly, the shift of the threshold voltage may be prevented and the reliability of the display device may be increased.

In the above, the transistor disposed in the display area of the display device is mainly described, however the insulating layer including the light blocking insulating layer may also be applied to an ASG transistor or an ESD transistor disposed in the non-display area. The light-emitting element layer or the color conversion layer is not disposed on the transistor of the non-display area, however the light emitted from the light-emitting element layer or the color conversion layer disposed in the display area may be incident at the side. Therefore, the threshold voltage may fluctuate even in a transistor located in a non-display area due to the light. However, according to exemplary embodiments of the present invention, when the insulating layer, including the light blocking insulating layer, is disposed on the transistor disposed in the non-display area, the shift of the threshold voltage may be prevented and the display device may be stably driven.

While exemplary embodiments of the present invention have been described herein in connection with the figures, it is to be understood that the invention is not limited to the disclosed embodiments, but is intended to cover various modifications and equivalent arrangements included within the spirit and scope of the instant disclosure.

What is claimed is:

1. A display device, comprising:
a first substrate;
a capacitive element disposed on the first substrate;
an interlayer insulating layer disposed between a pair of capacitive plates of the capacitive element;
a transistor disposed on the first substrate;
a light-emitting element connected to the transistor;
an insulating layer disposed between the transistor and the light-emitting element, the insulating layer separating the interlayer insulating layer from the light-emitting element;
a second substrate at least partially overlapping the first substrate; and
a color conversion layer disposed on the second substrate,
wherein the insulating layer includes a first insulating layer and a second insulating layer,
wherein a distance between the first insulating layer and the first substrate is less than a distance between the second insulating layer and the first substrate,
wherein the first insulating layer includes a light blocking material,
wherein the first insulating layer including the light blocking material is disposed between the color conversion layer and the first substrate;
wherein the transistor includes a source electrode and a drain electrode, and
wherein the first insulating layer, including the light blocking material, directly contacts a top surface of and a plurality of side surfaces of each of the source electrode, the drain electrode, and one of the capacitive plates of the capacitive element,
wherein the one of the capacitive plates is physically and directly connected to the source electrode, in a region not overlapping the light emitting element, by a common power line,
wherein the thickness of the first insulating layer is within a range of 2 μm to 4 μm, and the thickness of the second insulating layer is within a range of 2 μm to 4 μm,
wherein the thickness of the insulating layer is within a range of 4 μm to 8 μm, and
wherein the interlayer insulating layer is spaced apart from the light-emitting element by 4 μm to 8 μm.

2. The display device of claim 1, further comprising: a color filter layer disposed between the second substrate and the color conversion layer.

3. The display device of claim 2, wherein: the light-emitting element emits blue light.

4. The display device of claim 3, wherein: the light emitted from the light-emitting element sequentially transmits through the color conversion layer and the color filter layer and is then emitted outside the display device.

5. The display device of claim 1, wherein: the first substrate includes a non-display area, the transistor is disposed in the non-display area of the first substrate, and the insulating layer is disposed on the transistor of the non-display area.

6. The display device of claim 1, wherein:
the light-emitting element includes a first electrode, a light-emitting element layer, and a second electrode;
the first electrode is a triple-layered structure in which a transparent conductive oxide layer, a metal layer, and a transparent conductive oxide layer are sequentially stacked; and
the thickness of the metal layer is within a range of 500 Å to 1500 Å.

7. The display device of claim 6, wherein:
the insulating layer includes an opening;
the first electrode and the transistor are in contact with each other in the opening;
the first electrode has a step-shape in a region in the opening; and
a planarization layer is disposed over the step-shape region of the first electrode.

8. The display device of claim 1, wherein the transistor includes a semiconductor layer and a gate electrode, the light-emitting element overlaps the transistor in a direction perpendicular to a plane of the first substrate, and the first insulating layer including the light blocking material is disposed between the light-emitting element and the transistor.

9. A display device comprising:
a first substrate;
a semiconductor layer disposed on the first substrate;
an interlayer insulating layer disposed on the semiconductor layer;
a capacitive element disposed on the first substrate and including a first capacitive plate and a second capacitive plate separated from the first capacitive plate by the interlayer insulating layer,
a driving source electrode and a driving drain electrode disposed on the interlayer insulating layer;
A an insulating layer disposed on a top of the driving source electrode and a top of the driving drain electrode; and
a first electrode disposed on the insulating layer,
wherein the interlayer insulating layer and/or the insulating layer includes a light blocking material,
wherein the insulating layer includes a light blocking layer in direct contact with a top surface of and a plurality of side surfaces of each of the driving source electrode, the driving drain electrode, and the first capacitive plate,
wherein the first capacitive plate is physically and directly connected to the source electrode, in a region not overlapping a light emitting element, by a common power line, and wherein the interlayer insulating layer is spaced apart from the light-emitting element by the insulating layer at a distance of between 4 μm to 8 μm and the insulating layer include the light blocking layer with a thickness in a range of 2 μm to 4 μm and an other insulating layer with a thickness in a range of 2 μm to 4 μm.

\* \* \* \* \*